(12) United States Patent
Lindquist et al.

(10) Patent No.: US 6,198,355 B1
(45) Date of Patent: Mar. 6, 2001

(54) DUAL EDGE-TRIGGERED PHASE DETECTOR AND PHASE LOCKED LOOP USING SAME

(75) Inventors: Björn Lindquist, Bjärred; Magnus Nilsson, Lund, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/266,844

(22) Filed: Mar. 12, 1999

(30) Foreign Application Priority Data

Mar. 13, 1998 (GB) .................................................. 9805456

(51) Int. Cl.[7] .............................. H03L 7/085; H03D 13/00
(52) U.S. Cl. ................................ 331/27; 331/25; 327/12; 327/43
(58) Field of Search ........................ 331/25, 27; 327/12, 327/43

(56) References Cited

U.S. PATENT DOCUMENTS

| 4,814,726 | 3/1989 | Byrd et al. ........................... 331/1 A |
| 5,055,802 | 10/1991 | Hietala et al. .......................... 331/16 |
| 5,079,521 | 1/1992 | Gaskell et al. ...................... 331/1 A |
| 5,111,162 | 5/1992 | Hietala et al. ........................ 332/127 |
| 5,179,295 | 1/1993 | Mattison et al. ..................... 307/289 |
| 5,250,858 | 10/1993 | Strong ................................... 307/465 |
| 5,301,196 | * 4/1994 | Ewen et al. ....................... 370/105.2 |
| 5,528,240 | 6/1996 | Wilson et al. ........................ 341/143 |
| 5,552,785 | 9/1996 | Wilson et al. ........................ 341/143 |
| 5,592,110 | * 1/1997 | Noguchi ................................. 327/12 |
| 5,625,358 | 4/1997 | Wilson et al. ........................ 341/143 |
| 5,834,950 | * 11/1998 | Co et al. ................................ 327/12 |

FOREIGN PATENT DOCUMENTS

| 606779 | 7/1994 | (EP) . |
| 766403 | 4/1997 | (EP) . |
| 2091961 | 8/1982 | (GB) . |
| 5110427 | 4/1993 | (JP) . |
| 95/31861 | 11/1995 | (WO) . |
| 97/13325 | 4/1997 | (WO) . |

* cited by examiner

*Primary Examiner*—Siegfried H. Grimm
(74) *Attorney, Agent, or Firm*—Burns, Doane, Swecker & Mathis, L.L.P.

(57) ABSTRACT

There is disclosed a phase detector which triggers on both rising and falling edges of an input pulse signal. This effectively doubles the frequency of the input signal. When the phase detector is used in a phase locked loop, the doubled frequency means that a lower division ratio can be used, thereby reducing any noise contribution introduced thereby.

9 Claims, 3 Drawing Sheets

DUAL EDGE-TRIGGERED PHASE DETECTOR AND PHASE LOCKED LOOP USING SAME

This application claims priority under 35 U.S.C. §§119 and/or 365 to 9805456.2 filed in United Kingdom on Mar. 13, 1998; the entire content of which is hereby incorporated by reference.

BACKGROUND

This invention relates to a phase detector circuit, and in particular to a phase detector which can be used in a phase locked loop. More specifically, the invention relates to a phase detector which triggers on both edges of a system clock, thus effectively doubling the reference frequency without adding circuitry and noise.

In digital communication systems, for example in mobile telephone communications operating under the GSM or DCS systems, a technique of continuous phase modulation (CPM) is used.

Phase locked loops are well known. A signal at a reference frequency provides an input to a phase detector, the output of which is filtered and passed to a voltage control oscillator. The output from this voltage control oscillator is the output from the phase locked loop, and is also fed back to a frequency divider. The output from the frequency divider is fed back to the phase detector, and the circuit acts to bring the output of the loop to a frequency which is equal to the reference frequency multiplied by the division ratio of the frequency divider. Frequency or phase modulation is therefore achieved by using an input information-containing signal to control a programmable frequency divider, which is preferably a fractional-N divider, that is, one which can provide non-integer division ratios.

U.S. Pat. No. 4,814,726 shows a circuit of this type.

In general, in such a circuit, noise signals which appear in the reference signal, or are generated by the phase detector, are amplified by a factor which corresponds to the division ratio of the frequency divider. Therefore, it is advantageous to be able to increase the reference frequency, and hence reduce this division ratio. However, the introduction of, for example, a frequency doubler to increase the reference frequency and reduce the noise contribution, requires the addition of extra circuitry, and increases the size and current consumption of the circuit.

SUMMARY

In accordance with the invention, the reference frequency is effectively doubled by triggering on both edges of the signal clock. This produces the effect of a doubled reference frequency, without the associated increases in size and current consumption, in order to reduce the noise contribution to the circuit output.

According to one aspect of the invention, there is provided a phase detector which triggers on both edges of an input reference frequency signal.

According to a second aspect of the invention, there is provided a phase locked loop including a phase detector which triggers on both edges of the input reference frequency signal.

According to a third aspect of the invention, there is provided a fractional-N phase locked loop circuit, having a delta-sigma modulator to control the division factor thereof, in which the phase detector triggers on both edges of the input reference frequency signal.

DETAILED DESCRIPTION

Figure 1:
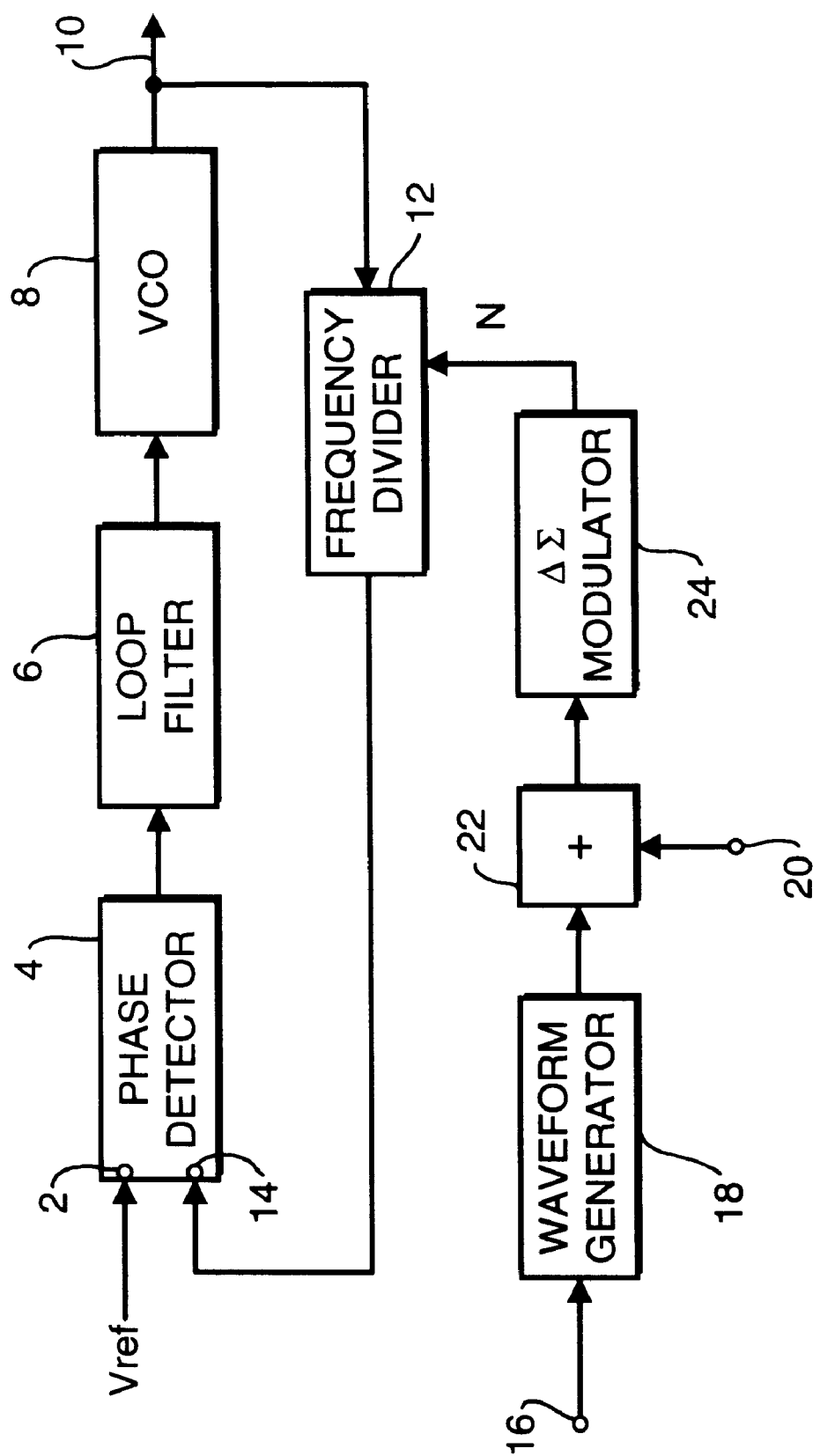
FIG. 1 shows a phase locked loop circuit in accordance with one aspect of the invention.

FIG. 1 is a block diagram of a fractional-N phase locked loop circuit, in which a delta-sigma modulator is used to control the division factor of the frequency divider, as used, in this example, in the transmit circuitry of a mobile communications device such as a mobile phone. Similar circuitry may be used to control the local oscillator frequency in the receive circuitry of such a device.

As is generally conventional, an input reference signal Vref having a reference frequency $f_{ref}$, is supplied to a first input 2 of a phase detector 4. The output from the phase detector 4 is filtered in a loop filter 6 and passed to a voltage controlled oscillator (VCO) 8, which supplies an output signal at the loop output 10. The output signal from the VCO 8, is also supplied to a frequency divider 12, where it is divided by a division ratio N. The divided output from the frequency divider 12 is supplied to a second input 14 of the phase detector 4.

As is well known, this feedback loop causes the output signal on the circuit output 10 to have a frequency equal to $N.f_{ref}$. Hence, the output frequency can be controlled by controlling the value of the division ratio N, and by using a programmable frequency divider 12 of a sort which is generally well known.

In the circuit of FIG. 1, an information signal, corresponding to the data to be transmitted, is supplied to a data input 16, and then to a waveform generator 18, in order to produce a signal having the instantaneous frequency of the desired modulated signal, divided by the reference frequency $f_{ref}$, and sampled at that frequency $f_{ref}$.

Based on the signal at a channel selection input 20, an offset can be added in an adder 22 to the signal from the waveform generator 18, and this provides an input to a sigma-delta modulator 24, which is then used to generate the desired division ratio N, for input to the frequency divider 12. Thus, the output signal produced on the loop output 10 is continuously phase modulated in response to the input data signal on the data input 16, to produce a signal for amplification and transmission by a conventional transmit circuit.

As the phase-locked loop (PLL) is a low-pass filter, with respect to the instantaneous frequency, it can be regarded as a device for reconstruction of the desired modulation signal. By choosing the bandwidth of the loop filter in the phase-locked loop to be sufficient for the modulation to pass, the output of the VCO 8 consists of a signal corresponding to the instantaneous frequency and phase noise corresponding to the quantization noise of the delta-sigma modulator. The phase noise can be decreased by either increasing the over-sampling factor or by increasing the roll-off of the filtering performed by the PLL. The latter is difficult without jeopardizing the stability margins of the PLL. The over-sampling factor could be increased by increasing the reference frequency, but it may not be possible to change this frequency, for example if this signal is also used as a system clock in the mobile station, or if suitable crystals are unavailable.

It is possible to double the frequency of the system clock signal with a frequency doubler to produce a higher reference frequency, but this introduces a source of noise into the loop and, moreover, increases the size and power consumption of the device.

In accordance with the invention, therefore, the phase detector 4 uses both edges of the input clock signal Vref, effectively doubling the reference frequency thereof, without the addition of any circuitry which increases the size or power consumption of the device. This effectively doubles the over-sampling ratio, without any increase in the noise contribution in the output signal.

It will be appreciated that a phase detector of this type may be used in other applications, for example in any phase locked loop. In such a circuit, the use of a doubled input frequency will halve the required values of the division ratio, and hence reduce any noise contribution introduced thereby.

Figure 2:
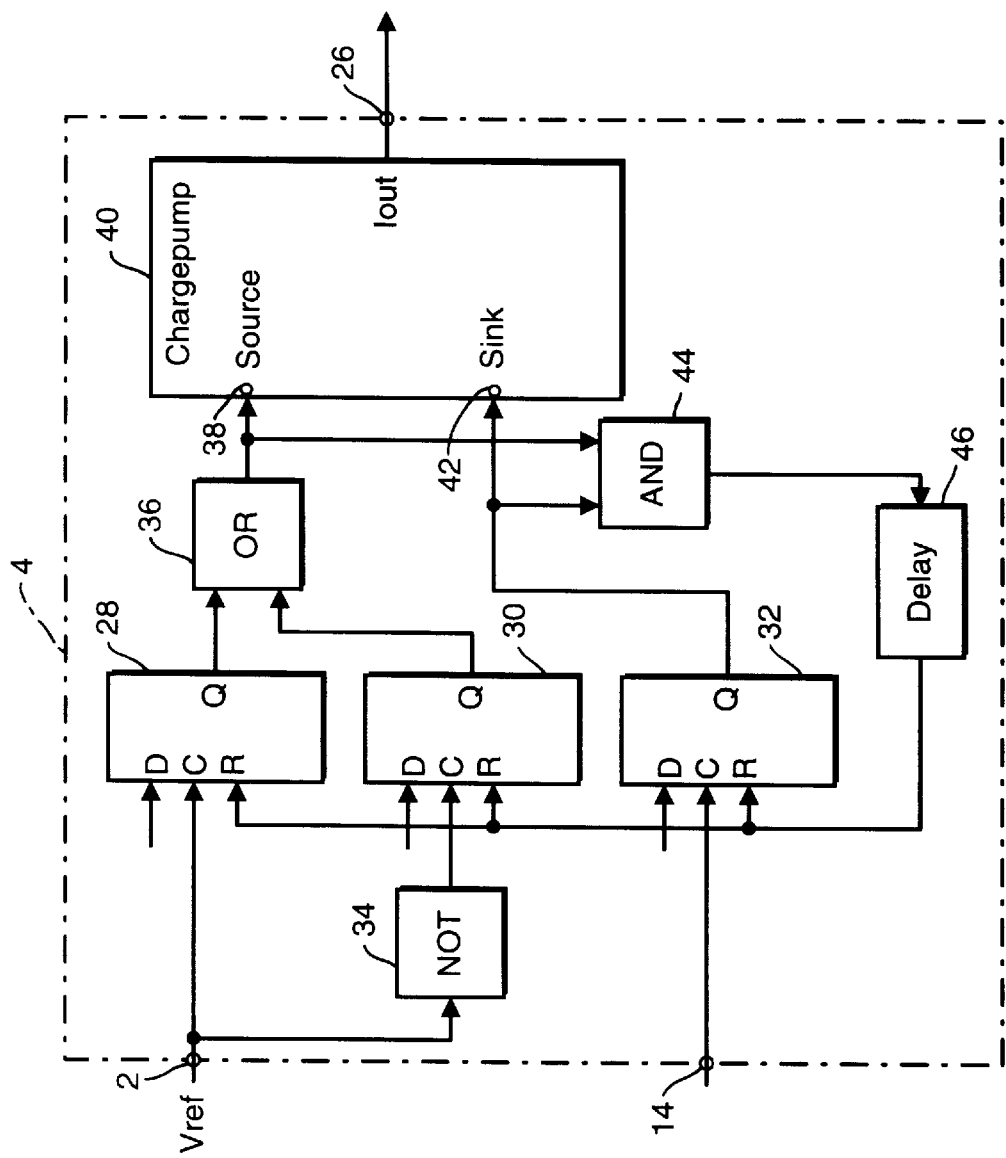
FIG. 2 is a block diagram of a phase detector in accordance with another aspect of the invention.

FIG. 2 shows in more detail the structure of the phase detector 4 which forms part of the device shown in FIG. 1. The phase detector 4 has a first input terminal 2, which receives the reference frequency signal Vref, a second input terminal 14, which receives the output from the frequency divider circuit 12, and an output terminal 26 which, in the circuit of FIG. 1, provides an input signal to the loop filter 6. As is known in phase detectors generally, the phase detector 4 produces an output at the output terminal 26 which represents the difference in phase between signals appearing at its two inputs 2, 14.

The phase detector 4 includes three D-type flip-flops 28, 30, 32, each of which has a data (D), clock (C) and reset (R) input terminal, and an output (Q). The data inputs (D) of each of the three flip-flops 28, 30, 32, receives in this case a "high" or "1" input.

The reference clock signal from the input terminal 2 is supplied to the clock input of the first flip-flop 28 and, on each rising edge of the reference clock signal, the flip-flop 28 is triggered to produce a signal on the output of the device. The input reference clock is also supplied to an inverter (NOT) (34), and the output inverted reference frequency therefrom is supplied to the clock input of the second flip-flop 30. Thus, this flip-flop triggers on each rising edge of the inverted reference frequency, at a time which corresponds to each falling edge of the reference frequency itself, and produces a signal on the output of this second flip-flop 30. Outputs from these two flip-flops 28, 30 are supplied to an OR-gate 36, the output of which is supplied to a source input 38 of a charge pump circuit 40.

The input signal on the second input terminal 14 of the phase detector 4 is supplied to the clock input of a third flip-flop 32, which is therefore triggered on each rising edge of that signal, and the signal produced on the output of that device is supplied to a sink control input 42 of the charge pump device 40.

AND-gate 44 receives the input signals supplied to the source control input 38 and sink control input 42 at the charge pump circuit 40, and produces an output pulse when both of these signals are high, namely when the output from the third flip-flop 32, and one of the outputs from the first and second flip-flops 28, 30, are both high. The AND-gate 44 output signal, delayed by a delay circuit 46 to avoid the deadband effect, is supplied to the reset input terminals of all three flip-flops 28, 30, 32.

The circuit is thus triggered twice in each clock cycle, once by the flip-flop 28 on the rising edge of the reference clock signal, and once by the flip-flop 30 at the time of the falling edge of the reference clock signal. In effect, therefore, the frequency of the reference clock has been doubled.

Figure 3:
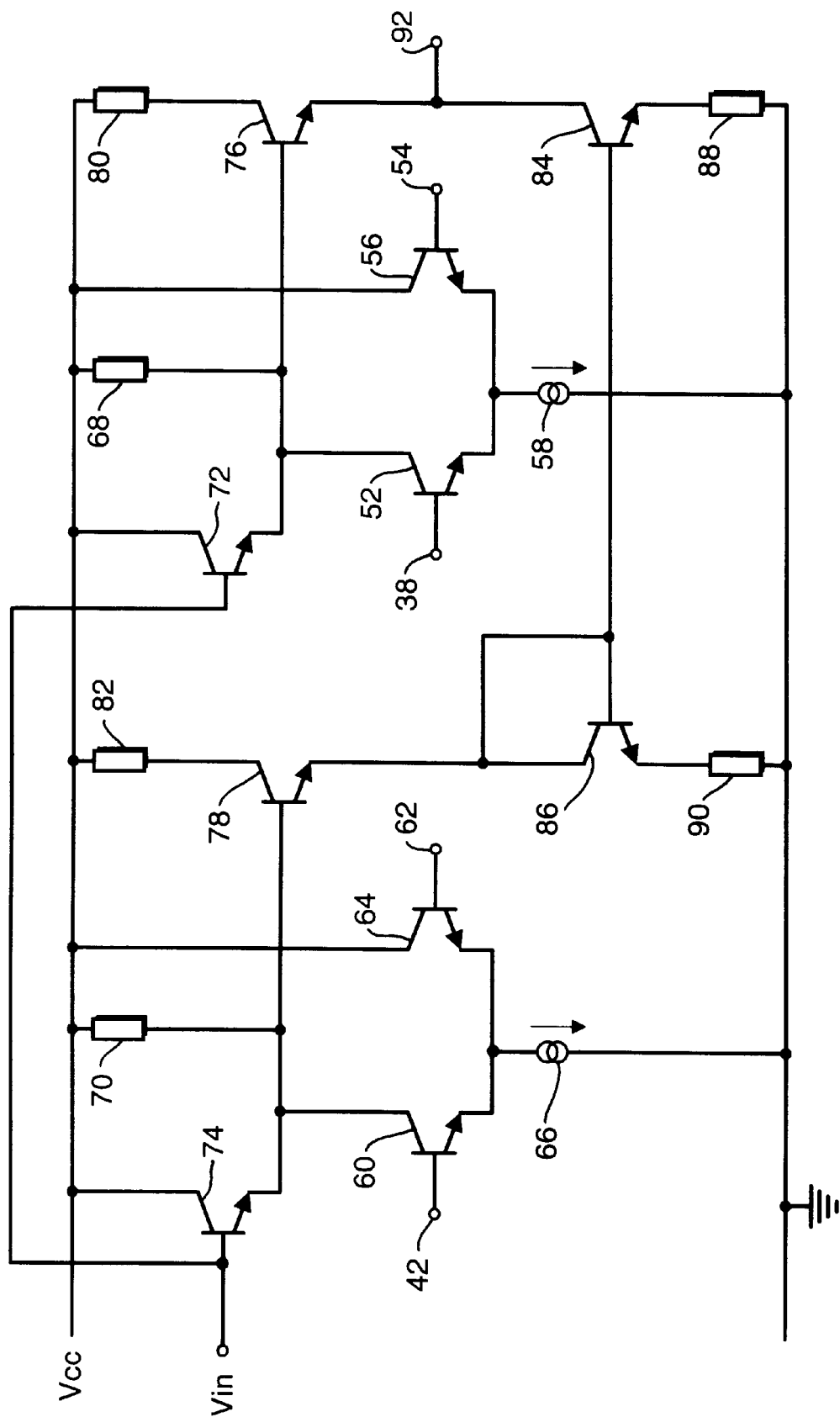
FIG. 3 is a circuit diagram showing, in more detail, one possible implementation of a part of the phase detector circuit of FIG. 2.

FIG. 3 is a circuit diagram showing the structure of the charge pump circuit 40. The source control signal from input terminal 38 is supplied to the base terminal of an NPN transistor 52, and an inverted source control signal is supplied to input 54, and hence to the base terminal of an NPN transistor 56. The emitters of the transistors 52, 56 are connected to ground through a current source 58.

The sink control signal supplied through the input terminal 42 is connected to the base terminal of an NPN transistor 60, and an inverted sink control signal is supplied to terminal 62 and then to the base of an NPN transistor 64. The emitters of the transistors, 60, 64 are connected to the ground rail through a current source 66.

The currents in the current sources 58, 66 set the rise and fall times of the output current pulses.

The collector terminals of the transistors 52, 60 are connected to the positive supply rail Vcc through respective resistors 68, 70, and the collector terminals of the transistors 56, 64 are connected directly to the positive supply Vcc.

An input voltage Vin which controls the magnitude of currents flowing in the circuit, is connected to the bases of NPN transistors 72, 74, the collectors of which are connected to the positive supply rail Vcc and the emitters of which are connected to the collector nodes of the transistors 52, 60 respectively. The magnitude of the input voltage Vin is constant, but can be altered to change the PLL closed loop bandwidth.

These nodes are also connected to the base terminals of respective PNP transistors 76, 78, the collecter terminals of which are connected to the positive supply rail Vcc through respective resistors 80, 82. Together, the magnitude of the input voltage Vin, and the resistances of the resistors 80, 82 set the magnitude of the output current pulses. The emitter terminals of the transistors 76, 78 are connected to the collector terminals of respective NPN transistors 84, 86, the base terminals of which are connected together, and the emitter terminals of which are connected to the ground rail through respective matched resistors 88, 90, which reduce the noise contribution of the transistors 84, 86. The collector and base terminals of the NPN transistor 86 are connected together.

The circuit thus consists of two equal current sources, mirrored through a current mirror. The magnitude of the differential input signal supplied through the differential input pairs 38, 54 and 42, 62 control the current sources, in particular the lengths of the current pulses supplied thereform, and hence the output current supplied through the transistor 84, and hence the output signal at the output terminal 92.

There is thus disclosed a phase detector which is triggered twice in each cycle of the input reference clock signal, and hence which effectively doubles the reference frequency.

What is claimed is:

1. A phase detector, comprising:
 a first input for receiving a reference clock signal;
 a second input for receiving a comparison signal;
 a first latch device coupled to the first input and being supplied the reference clock signal such that a pulse is generated in response to each positive-going edge of the reference clock signal;
 a second latch device coupled to the first input and being supplied the reference clock signal such that a pulse is generated in response to each negative-going edge of the reference clock signal;
 a first combinatorial logic device coupled to outputs of the first and second latch devices, for producing a doubled reference signal having a frequency twice that of the reference clock signal and having a pulse therein corresponding to each pulse generated by the first and second latch devices;

a third latch device coupled to the second input and being supplied the comparison signal such that a comparison pulse signal is generated in response to each positive-going edge of the comparison signal; and a charge pump device having a first control input coupled to the first combinatorial logic device for receiving the doubled reference signal and a second control input coupled to the third latch device for receiving the comparison pulse signal, the charge pump device producing a phase detector output representative of a phase difference between the phase of the comparison pulse signal and the phase of the doubled reference signal.

2. The phase detector as claimed in claim 1, further comprising:

a second combinatorial logic device, connected to outputs of the first combinatorial logic device and the third latch device, for producing a reset signal in response to the presence of a pulse from one of the first and second latch devices and a pulse from the third latch device, and for supplying the reset signal to reset the first, second and third latch devices after a predetermined delay.

3. A phase locked loop circuit comprising a phase detector, the phase detector including:

a first input for receiving a reference clock signal;

a second input for receiving a comparison signal;

a first latch device coupled to the first input and being supplied the reference clock signal such that a pulse is generated in response to each positive-going edge of the reference clock signal;

a second latch device coupled to the first input and being supplied the reference clock signal such that a pulse is generated in response to each negative-going edge of the reference clock signal;

a first combinatorial logic device coupled to outputs of the first and second latch devices, for producing a doubled reference signal having a frequency twice that of the reference clock signal and having a pulse therein corresponding to each pulse generated by the first and second latch devices;

a third latch device coupled to the second input and being supplied the comparison signal such that a comparison pulse signal is generated in response to each positive-going edge of the comparison signal;

a charge pump device having a first control input coupled to the first combinatorial logic device for receiving the doubled reference signal and a second control input coupled to the third latch device for receiving the comparison pulse signal, the charge pump device producing a phase detector output representative of a phase difference between the phase of the comparison pulse signal and the phase of the doubled reference signal; and a second combinatorial logic device, connected to outputs of the first combinatorial logic device and the third latch device, for producing a reset signal in response to the presence of a pulse from one of the first and second latch devices and a pulse from the third latch device, and for supplying the reset signal to reset the first, second and third latch devices after a predetermined delay.

4. The phase locked loop circuit as claimed in claim 3, further comprising:

a filter, acting on the phase detector output to produce a filtered phase detector output;

a voltage controlled oscillator, for producing an output signal at a frequency dependent on the filtered phase detector output; and a frequency divider, for receiving the output signal, and receiving a control signal from a delta sigma modulator, and producing the comparison signal by dividing the frequency of the output signal by a value determined by the control signal.

5. A phase locked loop circuit, comprising:

a phase detector;

a filter, acting on the phase detector output to produce a filtered phase detector output;

a voltage controlled oscillator, for producing an output signal at a frequency dependent on the filtered phase detector output; and a frequency divider, for receiving the output signal, and receiving a control signal from a delta sigma modulator, and producing a comparison signal;

wherein the phase detector comprises:

a first input for receiving a reference clock signal;

a second input for receiving the comparison signal;

means for converting the reference clock signal into a doubled reference signal having a frequency twice that of the reference clock signal;

means for generating a comparison pulse signal in response to each positive-going edge of the comparison signal;

means for comparing a phase of the comparison pulse signal with a phase of the doubled reference signal; and means for producing a phase detector output representative of a phase difference between the phase of the comparison pulse signal and the phase of the doubled reference signal.

6. A phase locked loop circuit, comprising:

a phase detector;

a filter, acting on the phase detector output to produce a filtered phase detector output;

a voltage controlled oscillator, for producing an output signal at a frequency dependent on the filtered phase detector output; and a frequency divider, for receiving the output signal, and receiving a control signal from a delta sigma modulator, and producing a comparison signal;

wherein the phase detector comprises:

a first input for receiving a reference clock signal;

a second input for receiving the comparison signal;

means for generating a first pulse signal in response to each positive-going and each negative-going edge of the reference clock signal;

means for generating a second pulse signal in response to each positive-going edge of the comparison signal; and means for comparing the phases of the first and second pulse signals.

7. The phase locked loop circuit as claimed in 6, wherein the means for generating the first pulse signal comprises:

a first latch device coupled to the first input and being supplied the reference clock signal such that a pulse is generated in response to each positive-going edge of the reference clock signal;

a second latch device coupled to the first input and being supplied the reference clock signal such that a pulse is generated in response to each negative-going edge of the reference clock signal; and a first combinatorial logic device coupled to outputs of the first and second latch devices, for producing the first pulse signal having a pulse therein corresponding to each pulse generated by the first and second latch devices.

8. The phase locked loop circuit as claimed in 6, wherein the means for generating the second pulse signal comprises:

a third latch device coupled to the second input and being supplied the comparison signal such that the second pulse signal is generated having pulses corresponding to each positive-going edge of the comparison signal.

9. The phase locked loop circuit as claimed in claim 6, further comprising:

a charge pump device having a first control input for receiving the first pulse signal and a second control input for receiving the second pulse signal;

wherein the means for generating the first pulse signal comprises:

a first latch device coupled to the first input and being supplied the reference clock signal such that a pulse is generated in response to each positive-going edge of the reference clock signal;

a second latch device coupled to the first input and being supplied the reference clock signal such that a pulse is generated in response to each negative-going edge of the reference clock signal; and a first combinatorial logic device coupled to outputs of the first and second latch devices, for producing the first pulse signal having a pulse therein corresponding to each pulse generated by the first and second latch devices;

wherein the means for generating the second pulse signal comprises:

a third latch device coupled to the second input and being supplied the comparison signal such that the second pulse signal is generated having pulses corresponding to each positive-going edge of the comparison signal.

* * * * *